United States Patent [19]

Holbrook et al.

[11] 4,352,835
[45] Oct. 5, 1982

[54] MASKING PORTIONS OF A SUBSTRATE

[75] Inventors: Walter R. Holbrook, Reading; William A. Sponsler, West Lawn, both of Pa.

[73] Assignees: Western Electric Co., Inc., Allentown, Pa.; Bell Telephone Laboratories, Inc., New York, N.Y.

[21] Appl. No.: 279,290

[22] Filed: Jul. 1, 1981

[51] Int. Cl.³ .............................................. B05D 3/06
[52] U.S. Cl. .................................... 427/38; 427/43.1; 427/53.1; 427/154; 427/156; 427/259; 156/664
[58] Field of Search ..................... 427/43.1, 53.1, 259, 427/154, 156, 38; 156/656, 664; 430/311, 319

[56] References Cited

U.S. PATENT DOCUMENTS

| | | | |
|---|---|---|---|
| 3,824,133 | 7/1974 | D'Asaro et al. | 148/1.5 |
| 4,022,927 | 5/1977 | Pfeiffer et al. | 427/43.1 |
| 4,024,293 | 5/1977 | Hatzakis | 427/43 |
| 4,122,215 | 10/1978 | Vratny | 156/656 |
| 4,165,395 | 8/1979 | Chang | 427/43 |
| 4,174,219 | 11/1979 | Andres | 430/321 |
| 4,181,755 | 1/1980 | Liu et al. | 430/314 |

OTHER PUBLICATIONS

E. C. Fredericks et al., "Polysulfone Lift-Off Masking Technique", IBM Technical Disclosure Bulletin, vol. 20, No. 3, 8/77, p. 989.
H. Dalal et al., "Cr-Cu-Cr Lift-Off Process", IBM Technical Disclosure Bulletin, vol. 20, No. 8, 1/78, pp. 3080-3081.
R. J. Bergeron, "Double Lift-Off Via Interconnection and Passivation Process", IBM Technical Disclosure Bulletin, vol. 21, No. 4, 9/78, pp. 1371-1372.

Primary Examiner—Shrive P. Beck
Attorney, Agent, or Firm—D. C. Watson

[57] ABSTRACT

A removable mask (22) protects at least one portion of a substrate (10) during treatment such as irradiation thereof. To obtain mask (22), there is applied over said portion of substrate (10) a parting layer (44) of a metal selected from the group consisting of nickel, aluminum, indium and tin. Over the parting layer (44), there is applied the removable mask (22) of a material which is adherent and harmless to the parting layer (44) and is substantially impenetrable by the treatment. After irradiation, the parting layer (44) is treated with at least a detaching agent sufficiently to detach said parting layer (44) and the mask (22) from substrate (10). For proton bombardment of a substrate (10) which includes gallium arsenide, the parting layer (44) is preferably nickel, the mask is preferably gold and the detaching agent includes hydrochloric acid.

10 Claims, 9 Drawing Figures

MASKING PORTIONS OF A SUBSTRATE

TECHNICAL FIELD

This invention relates to masking portions of a substrate. More particularly, the invention relates to removably masking at least one portion of a substrate to protect said portion during treatment such as irradiation of said substrate.

BACKGROUND OF THE INVENTION

It is customary in many industries to protect given portions of a workpiece during a treatment process using shields, masks and similar devices. Such devices should be applied and removed with facility and provide adequate protection from the effects of the treatment process.

In the semiconductor industry portions of wafers have been protected using a variety of techniques, many of which have been adapted from the lithographic arts. Wafers are coated with an organic film and, after masking and exposure, unwanted portions of film are developed and removed. Thereafter an additive or subtractive process is utilized to create electrical devices and circuit paths in the wafers. Frequently, especially for integrated circuits, masks of oxides or nitrides are used to control subsurface diffusion of elements to alter the electrical characteristics of substrate materials. More recently, particle bombardment has been employed to create subsurface electrical conditions and masks have been developed to withstand such bombardment.

Masks of noble metals to protect current channels in a substrate from proton bombardment have been applied and removed by different techniques. In one technique, a layer of chromium is applied and a layer of gold is applied over the chromium and the gold is then selectively etched away by potassium iodide except over the channels. In another technique, grid wires of tungsten are applied along the current channels to absorb the effects of bombardment.

Neither of the above techniques has been ideal for masks which are readily applied and removed and which permit process adjustments. The tungsten wires are not readily varied in thickness to suit slight variations desired in the width of portions of a substrate to be protected. Gold strips are readily varied in width but removal of gold is sometimes difficult because solutions which dissolve gold are often harmful to substrate materials. For example, potassium iodide and aqua regia attack some substrates such as those containing gallium arsenide and others containing gallium phosphide.

SUMMARY OF THE INVENTION

The present invention includes applying over a portion of a substrate, a parting layer of metal selected from the group consisting of nickel, aluminum, indium and tin. The parting layer is removable by application of a detaching agent which is harmless to the substrate. Over said parting layer, there is applied a masking layer of a material which is adherent and harmless to the parting layer and substantially impenetrable by the radiation.

In a further embodiment, after the irradiation is completed, the parting layer is treated with the detaching agent sufficiently to detach said parting layer and the mask from the substrate.

BRIEF DESCRIPTION OF THE DRAWINGS

The invention will be more readily understood from the following detailed description thereof when read in conjunction with the accompanying drawing, wherein.

Figure 1:
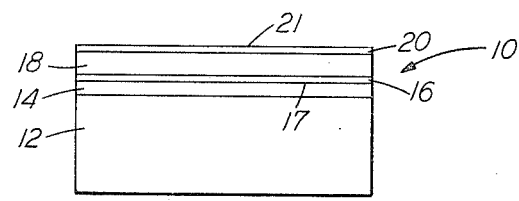
FIG. 1 is an end view of a wafer substrate including a laser structure ready for masking and irradiation in accordance with the prior art and the instant invention.

It can be seen that some elements in the figures are abbreviated or simplified to highlight certain features of the invention. Also, where appropriate, reference numerals have been repeated in the figures to designate the same or corresponding features in the drawing.

DETAILED DESCRIPTION

The Substrates

FIG. 1 illustrates a substrate designated generally by the numeral 10 which may be removably masked and irradiated in the practice of the invention. Such substrates will be described herein primarily with respect to semiconductor wafers found in the electronics industry. In such work, wafers are sometimes referred to as substrates because depositions are often made upon them. However, the invention should not be limited to semiconductors or to wafers upon which depositions are made. It is believed there are many applications in industry where substrate-like workpieces are masked for irradiation purposes.

In semiconductor work substrates have typically been irradiated with ions of boron, phosphorus and other dopants to create zones of p- or n-type electrical characteristics. Generally, oxide masks were employed and the purpose was to add acceptors or donors to the lattice structure of the substrate rather than to alter such structure. Later it was noted that high energy radiation, for example proton bombardment, which damaged crystalline structures, also produced regions of high resistivity in substrates. Such regions are generally considered useful for isolating devices or for confining current to a desired pathway.

Junction lasers and incoherent light emitting diodes are examples of optical devices which can be fabricated by utilizing damage irradiation of substrates. Substrate 10, shown in FIG. 1, is an example of a wafer for making double heterostructure (DH) junction lasers. The base 12 is a slice of n-GaAs monocrystal upon which are grown successive epitaxial layers in the following order: a wide bandgap n-AlGaAs layer 14, a narrower bandgap p-AlGaAs active region layer 16 forming a p-n heterojunction 17 therebetween, a wide bandgap p-AlGaAs layer 18 forming a p-p heterojunction with the active region layer 16 and a p-GaAs layer 20. The surface 21 of layer 20 is diffused with zinc to further improve its electrical contact properties. To confine the active region to narrow channels, it is desirable to create regions of high resistivity from the surface 21 to about the p-n junction 17.

PRIOR ART

Figure 2A:
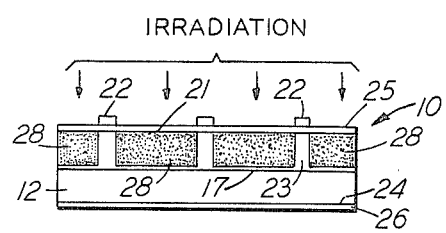
FIG. 2A is a simplified version of FIG. 1 showing a prior art gold mask protecting current channels from irradiation.

FIG. 2A is a simplified version of FIG. 1 showing a prior art mask 22 protecting current channels 23 from being irradiated. It is incidentally seen that base 12 of substrate 10 has been reduced in overall thickness after growing layers 14, 16, 17 and 18 as above-described. Such thinning facilitates later cleaving of each individual chip so a light beam is emitted at each end thereof from mirror-like crystalline surfaces. Also, a major n-surface 24 of base 12 has been metallized, for example, by evaporating a composite layer 26 of, respectively, tin, palladium and gold thereupon for electrical contacting purposes.

There is also seen in FIG. 2A, a layer 25 of a contact metal such as chromium which is quite often applied to provide ohmic contact with the p-surface 21. Alternatively, titanium and platinum (Ti-Pt) are successively applied as layer 25 for such contact and for protection during processing and to later receive a bonding layer. The use of Ti-Pt for layer 25 is preferable for adhering a thick gold pad which is electroplated upon surface 21 for bonding a completed laser chip to a mounting stud.

Upon layer 25, there is normally applied a masking layer 22 of a material and a thickness such that layer 22 is substantially impenetrable by the intended radiation. As an illustrative example, for high energy radiation such as proton bombardment, the metal gold is selected and applied. In the example shown in FIG. 2A, regions 28 of high resistivity are desired to a depth of about 3 microns below the p-surface 21. For this depth, and given a construction of substrate 10 heretofore described, an energy level of about 300,000 electron volts is required for suitable bombardment to form the regions 28. To mask channels 23 from such radiation a thickness of gold in the range of about 25,000 Å is known to provide adequate protection. A gold layer of such thickness is applied nonselectively, and photolithographic steps are typically employed to selectively obtain stripes of gold for the mask 22.

Figure 3A:
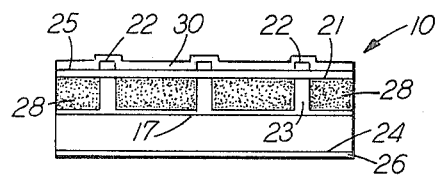
FIG. 3A is the same view as FIG. 2A, after irradiation, showing a gold layer applied over the prior art gold mask.

After the substrate 10 is irradiated a gold layer 30 is applied over the prior art gold mask 22 as shown in FIG. 3A. It is believed that the step of applying layer 30, without removing the stripes of mask 22, has been significant in the art. It has been found that removing the stripes from substrate 10 is a vexatious problem. Whether potassium iodide or aqua regia is employed as a solvent for the gold, a substrate 10 containing GaAs suffers from attack by such solvent. And such attack is apparent even with a chromium layer 25 present on substrate 10. Such a layer of chromium is known to typically contain random pin holes extending to surface 21 through which such solvents can attack the GaAs.

In an effort to avoid removing the gold stripes of mask 22, and with layer 30 overlying the stripes, devices formed from substrate 10 were sometimes mounted to a heat sink which was tin plated. It was felt that the bumps formed by the gold stripes under layer 30 were removed upon bonding since the tin plate of the heat sink formed a Sn-Au eutectic at the interface between the heat sink and the gold contact. However, when a Sn-Au eutectic was not properly formed, the bumps formed by the Au stripes have proven to be detrimental to proper operation of the laser. The laser is a powder device which generates heat in the active region 16 and the bumps caused perturbations in the transfer of heat to the bonding stud. Consequently, it is desirable to completely remove the stripes of mask 22 after bombardment and before applying layer 30 which forms bonding pads for the laser chips.

The removal of the stripes by the action of a chemical solvent has already been explained. Even where a titanium-platinum layer has been applied to surface 21, there has been evidence of deleterious chemical attack upon substrate 10 when gold is removed by a suitable solvent. Attempts have been made to remove the gold by mechanically abrading the stripes using an abrasive medium. However, neither chemical nor mechanical steps have proven effective at removing the mask 22 to the degree typically desired for junction lasers.

Figure 4:
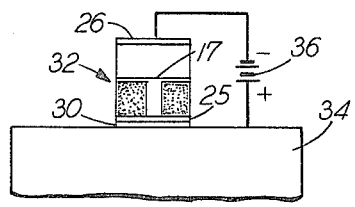
FIG. 4 is a pictorial view of a laser chip showing operation of a current channel formed by prior art masking and irradiation of portions of a substrate.

FIG. 4 is provided to more expressly illustrate several aspects heretofore referred to in operation of an assembled laser. A chip designated generally by the numeral 32, has been cleaved from substrate 10. Chip 32 has been inverted and a thick pad provided by layer 30 has been bonded to a heat sink 34. The laser operates by application of a forward bias D.C. source 36 between a contact to layer 26 and the heat sink 34. It will be appreciated that a uniform bond to heat sink 34 along layer 30 is advantageous for uniform thermal transfer.

Figure 2B:
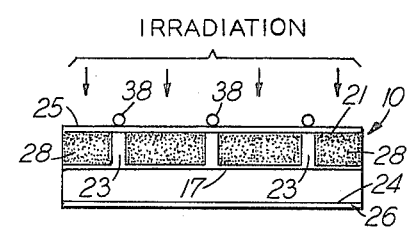
FIG. 2B is the same view as FIG. 2A, except that the gold is substituted with a prior art wire mask for protecting the current channels.
Figure 3B:
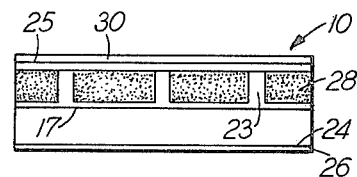
FIG. 3B is the same view as FIG. 2B, after the prior art masking wires have been removed.

FIGS. 2B and 3B illustrate another prior art method of removably masking portions of a substrate 10. Ancillary equipment (hereafter mentioned but not shown) is used to apply grid wires 38 as shown in FIG. 2B. The substrate 10 is first mounted to a fixture containing means, such as recessed grooves, to space the wires at regular lateral intervals. After the wires 32 are wound upon substrate 10 and the fixture, they are affixed to the fixture, for example, by cementing or welding, and the entire assembly is placed in an ion implant machine for the radiation treatment. Later the wires 32 are cut and the substrate is removed from the fixture for further processing.

The problems attendant upon the above described technique are manifold. The wire is typically the metal tungsten and is nominally about 3-5 microns in thickness, which is quite difficult to obtain with desired uniformity. Wires sometimes break during winding and exact spacing is difficult to obtain and retain without random dislocation. Also, the wires typically vibrate during bombardment, causing a narrowing of channels 23. Furthermore, wire masks are generally not thought to be versatile enough for modern technology.

The channel width obtained by bombardment at about the depth of the p-n junction 17 is subject to the implant energy level, the wire thickness and a phenomena known as end-of-range scattering. Ion particles generally travel on a straight path until their velocity approaches zero; then the particles tend to scatter. The extent to which scattering takes place is energy dependent; the higher the energy level, the wider the scattering. Consequently, the channel width near the p-n junction is less than that at surface 21 and varies according to the energy required to penetrate to the depth desired. The problem is that an ideal depth is not always the same because layers 18 and 20 (FIG. 1) vary in thickness from wafer to wafer. Consequently, the energy level is varied to suit a measured depth and the mask width should be varied to account for scattering. It will be appreciated that it is not as easy to obtain subtle variations in width using wires as it is in using gold stripes defined by photolithographic techniques. However, the wires are easily removed, leaving a clean surface for applying a uniformly smooth layer 30 as shown in FIG. 2B.

MASKING WITH PARTING LAYERS

Figure 5:
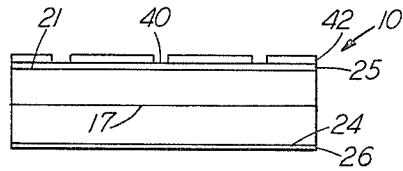
FIGS. 5 and 6 are each simplified versions of FIG. 1 showing successive steps in application of a mask and a parting layer.
Figure 6:
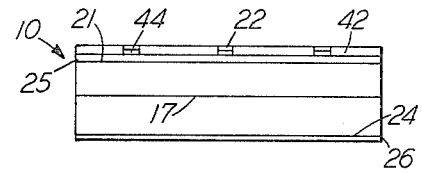

FIGS. 5 and 6 are simplified versions of FIG. 1 illustrating successive steps in application of a mask over a parting layer in accordance with the instant invention. Note in both figures that the substrate 10 has been thinned and metallized as previously described and illustrated in FIGS. 2A and 2B.

As has been discussed above, masking materials which resist radiation are typically difficult to remove from a substrate because many such materials include the heavier and/or more noble metals. If the metals are to be removed by dissolution thereof, harsh chemicals are often required which sometimes attack one or more materials in a substrate. Consequently, it is desirable to remove such masks without employing a solvent for the materials of the mask.

Masks of gold are particularly advantageous for radiation treatment because gold is a dense metal which is readily applied to a substrate by evaporation or by plating and a thin layer is highly resistant to penetration. Consequently, it is desirable to remove a layer of gold from a substrate without having to dissolve the gold.

FIG. 5 shows openings 40, formed in a layer 42 of photoresist material by conventional photolithographic techniques. Such openings 40 overlie and correspond with current channels desired to be formed in substrate 10 by forming subsurface regions of high resistivity between the current channels. FIG. 6 shows the openings 40 after a parting layer 44 and stripes of a mask 22 have been applied therein. Thereafter the remaining photoresist layer 42 is removed, especially thoroughly for proton bombardment, which hardens photoresist, rendering it difficult to remove without damage to the wafer.

The material for mask 22 is selected of a type which will adhere to a parting layer 44 and which will be substantially impenetrable by the intended treatment process. For low energy radiation comprising, inter alia, X-rays, U.V. light and gamma rays, the mask could be made of any of a variety of well known materials, such as lead. For high energy radiation comprising, inter alia, bombardment with protons or deuterium, the mask material advantageously is a noble metal such as tungsten or gold. Given the excellent application and shielding properties of gold, it serves as an excellent masking material for both low and high energy radiation as well as for other non-radiation treatment.

The interaction between chemicals, metals, substrates and processes as described herein is often said to be without harm or harmless to a specific component. It is to be understood, however, that such expression does not mean that there is no transformation in the unharmed component; it does indicate that any such transformation is of no substantial consequence in the work and, therefore, can be considered to be harmless.

The material for layer 44 should be adherent and harmless to the substrate 10 and the mask material. Once installed, layer 44 should also be substantially resistant to conditions occurring during the treatment process. Such conditions include but are not limited to, generation of heat, ion scattering, radiation and in particular, attack upon the thin edges of the layer which are exposed to the treatment.

A primary function of layer 44 is to serve as a sacrificial layer when the overlying mask 22 is to be removed. Layer 44 is referred to as a parting layer because it enables the substrate to part with the mask without necessarily treating the substrate or mask itself either chemically or physically.

To achieve the parting function in the illustrative example, the metal nickel is selected and applied for layer 44. For the proton bombardment of GaAs as previously explained with regard to FIGS. 2A and 2B, a thickness of about 5–10,000 Å of nickel is applied to openings 40. The layer 44 of such thickness is applied over the contact layer 25, preferably by electroplating. The nickel adheres well to the GaAs substrate 10 which is sufficiently resistant to a conventional nickel sulfamate plating process for applying substantially stress-free nickel to a substrate. Furthermore, such a layer of nickel is receptive to most masking materials applied thereon.

After the nickel is applied, stripes of a material and a thickness suitable for the nickel and the radiation are applied thereon to form mask 22. Gold is advantageously selected and preferably electroplated upon the nickel layer 44 by a conventional potassium gold cyanide process. The process is harmless to the GaAs substrate 10 and the nickel layer 22 and provides a substantially stress-free and adherent layer 22 of gold upon the nickel layer 44. For the energy level and other conditions described with respect to FIGS. 2A and 2B, a thickness of about 25,000 Å of gold is applied upon the nickel to provide adequate protection from the proton radiation.

Figure 7:
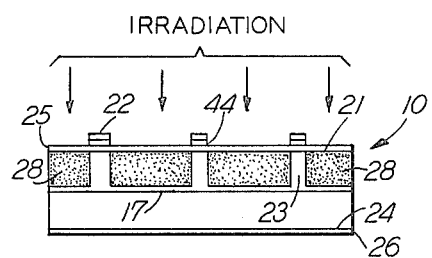
FIG. 7 is the same view as FIG. 6 showing current channels being formed by masking and irradiation.

After the photoresist layer 42 is removed, the substrate 10 containing mask 22 over layer 44 is irradiated as illustrated in FIG. 7. Regions 28 of high resistivity are created to define with accuracy the current channels 23, particularly in the area of the p-n junction 17.

Figure 8:
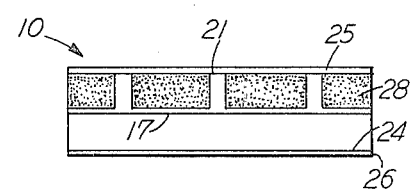
FIG. 8 is the same view as FIG. 7, after irradiation and after the mask has been removed by application of a detaching agent.

After the irradiation treatment, the parting layer 44 and the gold mask therewith are removed from substrate 10 to obtain the condition shown in FIG. 8. Such removal is advantageously achieved by treating the parting layer 44 with at least the detaching agent sufficiently to detach said parting layer and the mask from substrate 10. The treatment of the parting layer may be chemical and mechanical and should take into account any vulnerability of GaAs substrate 10 to such treatment.

For the illustrative example shown in FIG. 7, substrate 10 was immersed in an aqueous solution of hydrochloric acid at room temperature. The acid was A.C.S grade (36½%–38% assay) and ultrasonic agitation was applied without mechanical abrasion of the mask to achieve detachment. The parting layer 44 became detached in about 4 minutes after immersion and to gold mask 22 floated away with layer 44. The substrate 10 was then immersed in a flowing rinse of deionized water for about 5 minutes which was sufficient to remove the acid and any particles of nickel or gold. Upon inspection the materials in substrate 10, including GaAs, were unaffected by the acid treatment. Laser chips cleaved from substrate 10 were found to perform well.

In a broader practice of the invention, masking with parting layers has been extended to other metals utilizing application and removal processes appropriate thereto. Because adequate removal of the gold without damage to substrate 10 was a problem in the prior art, such removal without damage was considered significant to demonstrate the usefulness of such other parting layers. Of course removal time and expense were also considered as secondary factors.

All examples were performed on a substrate 10 having the double heterostructure described for junction lasers. Current channels 23 about 3–5 microns wide at surface 21 and about 3 microns deep were created in the substrates as was done in the illustrative example. Regions 28 therebetween of high resistivity were created by the same proton radiation described previously. All chemicals were of A.C.S. grade and rinsing was done as before using deionized water. Using these common elements the following examples further explain the practice of the invention:

Additional Example No. 1

A parting layer 44 of the metal aluminum was applied about 5–10,000 A thick to openings 40 on a substrate 10 by electron gun evaporation and the GaAs in the substrate was found to be adequately resistant to the process. The aluminum adhered well to the Ti-Pt layer 25 of the substrate and was receptive to a gold mask 22 which was electroplated thereupon to a thickness of about 25,000 A.

After irradiation, the substrate 10 was immersed in a solution at room temperature containing the following constituents by volume: 85% phosphoric acid (85% minimum assay), 5% nitric acid (69–71% assay), 5% glacial acetic acid (min. 99.7% assay) and 5% water. The reaction time to adequately detach the aluminum parting layer 44 from substrate 10 was about 2½ minutes with ultrasonic agitation and no mechanical abrasion. The substrate 10 was then immersed in a flowing water rinse for about 10 minutes to remove the detaching solution and any particles of aluminum or gold. Upon inspection the materials in substrate 10, including GaAs, were unaffected by the acid treatment and the gold was adequately removed.

Additional Example No. 2

A parting layer 44 of the metal tin was applied about 5–10,000 A thick to openings 40 on a substrate 10 by electroplating. The tin was applied utilizing a conventional tin cyanide plating process and the GaAs in the substrate was found to be adequately resistant to such plating process. The tin adhered well to Ti-Pt layer 25 of the substrate and was receptive to a gold mask 22 which was electroplated thereupon to a thickness of about 25,000 A.

After irradiation, the substrate 10 was immersed in a solution at room temperature containing the following constituents by volume: 98% hydrochloric acid (36½% to 38% assay) and 2% hydrogen peroxide (29–32% assay). The reaction time to adequately detach the tin parting layer 44 from substrate 10 was about 6 minutes with ultrasonic agitation and no mechanical abrasion. The substrate 10 was then immersed in a flowing water rinse for about 10 minutes. Upon inspection the materials in the substrate 10, including GaAs, were unaffected by the detaching treatment and the gold was adequately removed.

Additional Example No. 3

Not all steps in this example were fully performed as was done with the nickel, aluminum and tin examples. However, enough experiment has been done to predict with certainty that the metal indium will serve well as a parting layer 44. A ribbon of indium was applied on a substrate 10 utilizing a sintering process. The GaAs in the substrate was found to be adequately resistant to such sintering process. The indium adhered well to the substrate; however, a mask of gold was not applied to the indium because indium is well known to receive gold plated thereon. It is further predictable that indium will plate well upon GaAs using a conventional indium fluoroborate process and that GaAs will be resistant thereto.

The substrate 10 was immersed in a solution at room temperature containing A.C.S. grade hydrochloric acid without agitation. The reaction time to completely remove the thick indium layer was about ½ hour. Based on this experiment it is expected that a thin (5–10,000 A) layer of indium under gold would be removed in about 5–15 minutes. The action of hydrochloric acid upon indium and the ease of application indicates that removal of the metal from a GaAs substrate would be similar to that found for a nickel parting layer.

Figure 9:
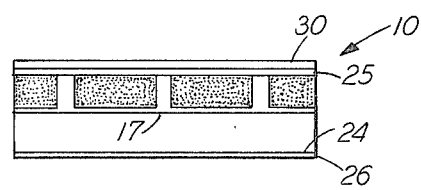
FIG. 9 is the same view as FIG. 8 showing a thick gold layer applied to the substrate.

Referring now to FIG. 9, the substrate 10 is shown after the irradiation treatment and after preferred contact metals have been applied. Note that a thick (10 micron) gold layer 30 has been applied over the Ti-Pt layer 25 on p-surface 21. When laser chips are scribed and cleaved from substrate 10, a chip will be inverted and layer 30 will be bonded to a heat sink as shown in FIG. 4.

Practical embodiments of the present invention have been described and illustrated herein. Yet it is to be understood that various modifications and refinements may be utilized which digress from these disclosed embodiments without departing from the spirit and scope of the present invention.

For example, it is known to use proton bombardment to achieve regions of high resistivity in both n- and p-type GaAs. This technique has been applied in the fabrication of non-optical devices. These include the formation of isolation regions between p-n junction diodes and the formation of guard rings for Schottky barrier diodes.

It is well known to use oxides to mask for implantation of dopants such as boron or phosphorus into semiconductor substrates such as those containing silicon. It is expected, that a gold mask of a material applied over a parting layer in accordance with the instant invention will do an excellent job of removably masking portions of such substrates.

What is claimed is:

1. A method of removably masking at least one portion of a substrate to protect said portion during irradiation of said substrate, comprising:
    applying over said portion, a parting layer of metal selected from the group consisting of nickel, aluminum, indium and tin, said layer being removable from the substrate by application of a detaching agent which is harmless to the substrate; and
    applying over said parting layer, a masking layer of material, said material being adherent and harmless to the parting layer and being substantially impenetrable by the radiation.

2. A method as in claim 1, further comprising, after the irradiation is completed:
treating the parting layer with at least the detaching agent sufficiently to detach said parting layer and the mask from the substrate.

3. A method as in claim 2, wherein the substrate includes gallium arsenide, the parting layer is nickel and the detaching agent includes hydrochloric acid.

4. A method as in claim 2, wherein the substrate includes gallium arsenide, the parting layer is aluminum and the detaching agent includes by volume, about 85% phosphoric acid, about 5% nitric acid, about 5% acetic acid and about 5% water.

5. A method as in claim 2, wherein the substrate includes gallium arsenide, the parting layer is indium and the detaching agent includes hydrochloric acid.

6. A method as in claim 2, wherein the substrate includes gallium arsenide, the parting layer is tin and the detaching agent includes by volume, about 98% hydrochloric acid and about 2% hydrogen peroxide.

7. A method as in claim 3 or 4 or 5 or 6, wherein the masking layer includes the metal gold.

8. A method as in clam 7, wherein irradiating the substrate includes bombarding the substrate with protons.

9. A method of removably applying, over at least one portion of a substrate, a gold mask to protect said portion during irradiation of said substrate, comprising:
applying over said portion, a parting layer of metal selected from the group consisting of nickel, aluminum, indium and tin, said layer being removable from the substrate by application of a detaching agent which is harmless to the substrate; and
applying over said parting layer, a masking layer including the metal gold, said layer being adherent and harmless to the parting layer and being substantially impenetrable by the radiation.

10. A method as in claim 9, further comprising, after the substrate irradiation is completed:
treating the parting layer with at least the detaching agent sufficiently to detach said layer and the gold mask from the substrate, thereby obviating a need to treat the gold mask to achieve removal thereof.

* * * * *